(12) United States Patent
Ng et al.

(10) Patent No.: US 9,735,382 B2
(45) Date of Patent: Aug. 15, 2017

(54) CIRCUIT LAYOUT FOR THIN FILM TRANSISTORS IN SERIES OR PARALLEL

(71) Applicant: Palo Alto Research Center Incorporated, Palo Alto, CA (US)

(72) Inventors: Tse Nga Ng, Palo Alto, CA (US); David Eric Schwartz, Menlo Park, CA (US); Janos Veres, San Jose, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 146 days.

(21) Appl. No.: 13/672,366

(22) Filed: Nov. 8, 2012

(65) Prior Publication Data

US 2014/0124742 A1 May 8, 2014

(51) Int. Cl.
*H01L 27/088* (2006.01)
*H01L 51/05* (2006.01)
*H01L 29/786* (2006.01)

(52) U.S. Cl.
CPC .... *H01L 51/0554* (2013.01); *H01L 29/78645* (2013.01)

(58) Field of Classification Search
CPC .............. H01L 51/0554; H01L 29/78645
See application file for complete search history.

(56) References Cited

U.S. PATENT DOCUMENTS

| | | | |
|---|---|---|---|
| 8,283,655 B2 | 10/2012 | Chabinyc | |
| 2004/0004257 A1* | 1/2004 | Lee | H01L 28/60 257/390 |
| 2005/0056882 A1* | 3/2005 | Lojek | H01L 21/28273 257/316 |
| 2005/0243601 A1* | 11/2005 | Harari | G11C 11/5621 365/185.3 |
| 2005/0285099 A1* | 12/2005 | Bao | H01L 51/0545 257/40 |
| 2009/0196096 A1* | 8/2009 | Liu | B60G 11/27 365/163 |
| 2009/0283827 A1* | 11/2009 | Pendharkar | H01L 29/0847 257/343 |
| 2010/0238711 A1* | 9/2010 | Asao | G11C 8/14 365/148 |
| 2010/0285650 A1* | 11/2010 | Shi | H01L 21/26586 438/286 |
| 2011/0068414 A1* | 3/2011 | Anderson | H01L 29/66795 257/401 |

(Continued)

*Primary Examiner* — Victor A Mandala
(74) *Attorney, Agent, or Firm* — Marger Johnson (57) ABSTRACT

Multiple thin film transistors are aligned in serial and parallel orientation. A second source region is disposed between a first source region and a first drain region. A second drain region is disposed between the first source region and the first drain region. The second drain region and the second source region substantially coincide. A first gate is disposed between the first source region and the coinciding second source and second drain regions. A second gate region is disposed between the first drain region and the coinciding second source and second drain regions. An semiconductor is disposed between the first source region, the first drain region, and the coinciding second source and second drain regions. A dielectric material is disposed between the semiconductor substrate and the first and second gates.

11 Claims, 9 Drawing Sheets

(56) References Cited

U.S. PATENT DOCUMENTS

| | | | |
|---|---|---|---|
| 2011/0141806 A1* | 6/2011 | Kim | G11C 16/0441 365/185.2 |
| 2012/0074467 A1* | 3/2012 | Abe | H01L 27/11519 257/208 |
| 2012/0329231 A1* | 12/2012 | Mikhalev | H01L 21/265 438/296 |
| 2013/0307080 A1* | 11/2013 | Chih | H01L 21/823412 257/368 |

* cited by examiner

CIRCUIT LAYOUT FOR THIN FILM TRANSISTORS IN SERIES OR PARALLEL

BACKGROUND

The conventional structure of an individual thin-film transistor (TFT) consists of two lateral electrodes for source and drain current collection or injection, modulated by a third gate electrode. The source and drain electrodes are usually conductors, such as silver, gold, copper, doped polymer, or conductive oxides such as indium tin oxide.

U.S. Pat. No. 8,283,655, issued to Chabinyc, et al., and entitled "Promoting Layered Structures with Semiconductive Regions or Subregions," discloses structures, devices, arrays, and methods related to thin-film fabrication. Layered structures, channel regions, and light-interactive regions can include the same semiconductive polymer material, such as with an organic polymer.

Generally, TFT circuits are laid out by connecting individual TFTs and other elements with metal interconnect. In organic circuits, a pair of unipolar (i.e., both n-type or both p-type) TFTs is typically realized by laying out two separate TFTs and wiring them together. For example, in a series-connected stack configuration, the source of one TFT is wired to the drain of the other TFT with interconnect, generally formed in the drain or source metal layer. An issue with TFT circuits is the large area necessitated by low mobility and limitations of printing resolution and registration, where printing techniques are used.

Accordingly, there remains a need for an improved structure for TFTs that increases transistor density and reduces the area required for a circuit design. As has been observed with silicon semiconductor devices, higher densities inevitably lead to higher computing power. The promise of combining the higher computing power, as seen in silicon circuits, with the economic efficiencies of TFTs will ultimately lead to improved computing devices.

DETAILED DESCRIPTION

By laying two TFTs side-by-side such that the source of the first coincides with the drain of the second, the area of TFTs connected in series is greatly reduced in an embodiment of the invention. This technique is not limited to pairs of TFTs, but is applied to stacks of three or more TFTs. Additionally, the technique can be adapted to arrange TFTs in parallel by laying out two or more TFTs with their respective source regions and drain regions coinciding.

Figure 1:
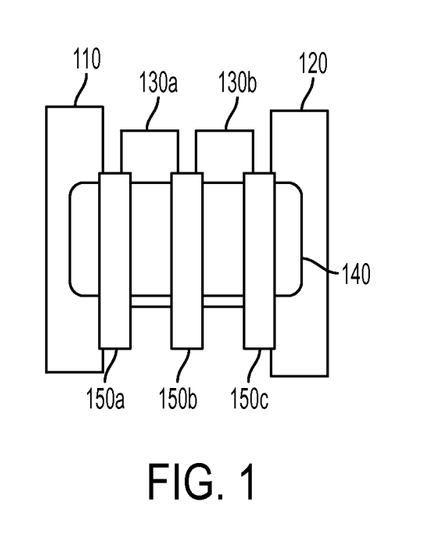
FIG. 1 is a top view of an exemplary stack of three thin film transistors arranged in series, with a metal layer in each source and drain region.
Figure 2:
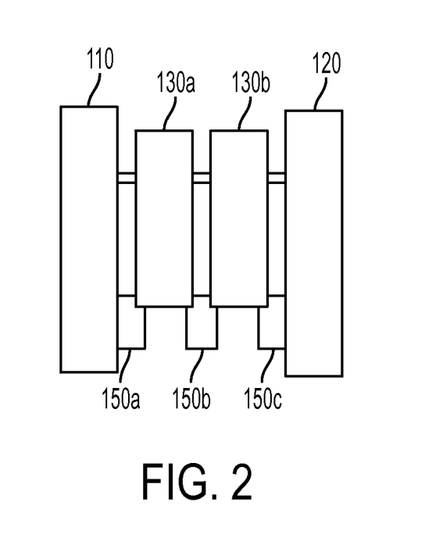
FIG. 2 is a bottom view of FIG. 1.
Figure 3:
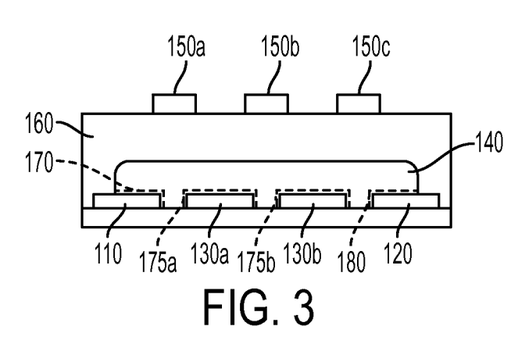
FIG. 3 is a side view of FIG. 1.
Figure 4:
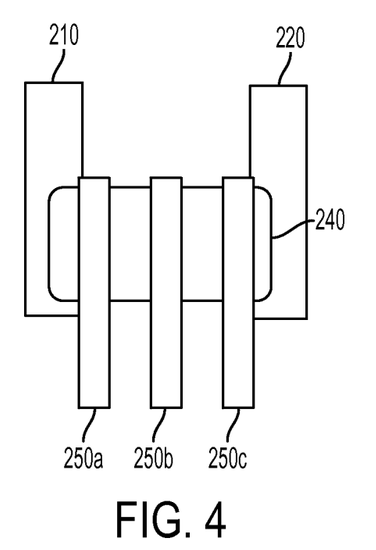
FIG. 4 is a top view of an exemplary stack of three thin film transistors arranged in series, without metal layers in the intermediary source and drain regions.
Figure 5:
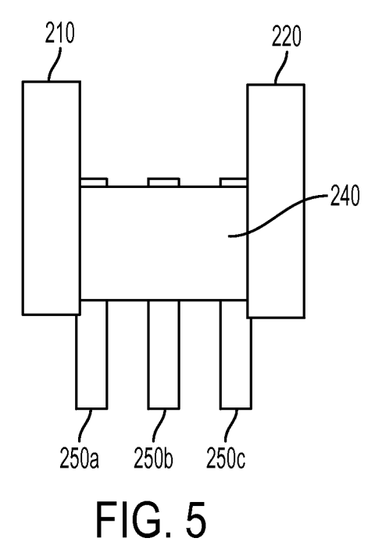
FIG. 5 is a bottom view of FIG. 4.
Figure 6:
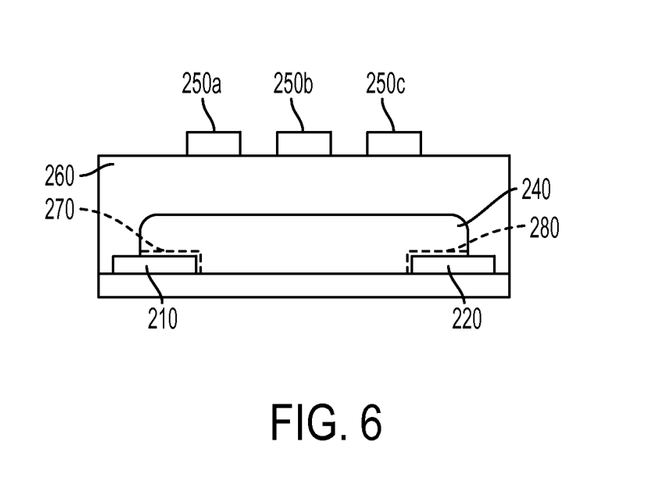
FIG. 6 is a side view of FIG. 4.
Figure 7:
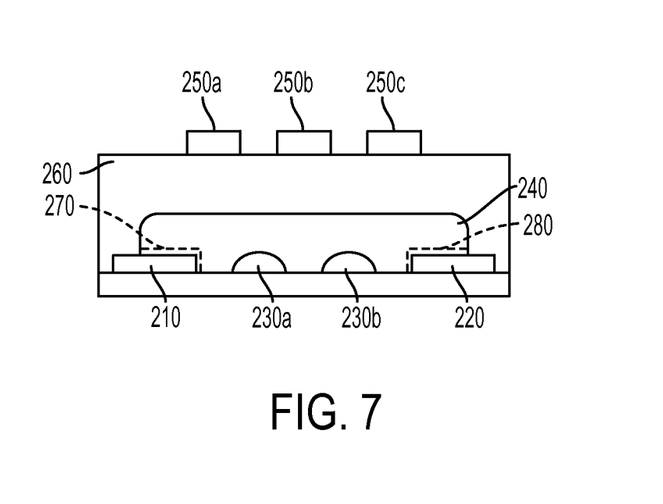
FIG. 7 is another side view of FIG. 4, further illustrating intermediary source and drain regions without an accompanying metal layer.

In an embodiment, as illustrated by FIGS. 1-3, three TFTs are arranged so that a single combined source or drain region replaces a separate source and separate drain region of two TFTs connected in series, in addition to replacing the interconnect of a traditional design. In FIG. 3, source region 170 and drain region 180 terminate a series of source and drain terminals Occupying a portion of source region 170 is a source conductor 110, and occupying a portion of drain region 180 is a drain conductor 120. Gate 150*a* is located between source region 170 and a drain region 175*a* that also doubles as a source region 175*a* for gate 150*b*. Metal layer 130*a* occupies a portion of the coinciding source/drain region 175*a*. The metal layer 130*a* serves as both a source and drain conductor, and may be substituted for other conductive materials, such as a conductive polymer, a metal oxide, or a doped semiconductor material. In addition, the conductive materials 130*a* and 130*b* may be of materials different than the materials of conductors 110 and 120. In some embodiments, source or drain conductors may be affixed to points of contact on the semiconductor.

Source region 175*a* and drain region 175*b* form the second of three TFTs with gate 150*b*. Similarly, source region 175*b* and drain region 180 form the third of the three TFTs with gate 150*c*. Metal layer 130*b* occupies a portion of the source/drain region 175*b*. The gates 150*a-c* and dielectric 160 are of materials and dimensions such that a potential applied between the gate and any source or drain can induce depletion or enhancement of a channel or part of a channel between the source and drain regions. It is important to note that regions 175*a* and 175*b* occupy a dual role as both a source and drain for the multiplicity of transistors formed by the structure of FIGS. 1-3.

In an embodiment, gates 150*a-c* are formed from a metallic conductor layered onto the dielectric 160 with a printing process. Similarly, the metal layers 110, 130*a*, 130*b*, and 120 occupy a portion of the drain and source regions 170, 175*a-b*, and 180 are layered onto a substrate with a printing process. In an embodiment, a semiconductor material such as solution blends of organic semiconductors, inorganic solgel, or nano-particle dispersion is spread over the conductors of drain/source regions 170, 180, and 175*a-b*, which later forms a solid thin film. Dielectric material 160 then tops the semiconductor material 140, separating the gates 150*a-c* from the semiconductor 140 and the source/drain regions 170, 180, and 175*a-b*.

FIGS. 4-7 depict the coinciding transistors of FIGS. 1-3 in series without intermediary metal layers 130*a* and 130*b*, as shown in regions 175*a* and 175*b*. A source region 270 with source conductor 210 begins the series of TFTs with gate 250*a*. The drain for this first TFT is not shown in FIG. 6, but is in proximity to where metal layer 130*a* would otherwise be. It is denoted by the region 230*a* in FIG. 7. The drain region 230a for this first TFT also functions as a source region 230a for the second TFT, having gate 250b. The drain for the second TFT is located in proximity to where metal layer of region 130b would otherwise be and is depicted by region 230b. The drain region 230b for this second TFT also functions as the source region 230b for the third and final TFT with gate 250c. The third TFT terminates with drain region 280 and ends the series of three TFTs. Like the source region 170 and drain region 180 of FIGS. 1-3, metal layers 210 and 220 occupy a portion of source region 270 and drain region 280.

For some TFT materials and processes, including organic semiconductors and printing, in comparison to the structure of FIGS. 1-3, the structure of FIGS. 4-7 can have inferior performance. The organic semiconductor material 140 and 240 has a high intrinsic resistivity, which increases the on-resistance of the TFT stack. The observation that this structure has such high resistivity suggests that it is less suitable for use with organic TFTs. Nonetheless, this disadvantage is overcome by other benefits. For example, the structure of FIGS. 4-7 reduces the likelihood of shorting the connections between serial source and drain terminals, as might be possible with the connections between conductors 110 to 130a, 130a to 130b, and 130b to 120.

Figure 8:
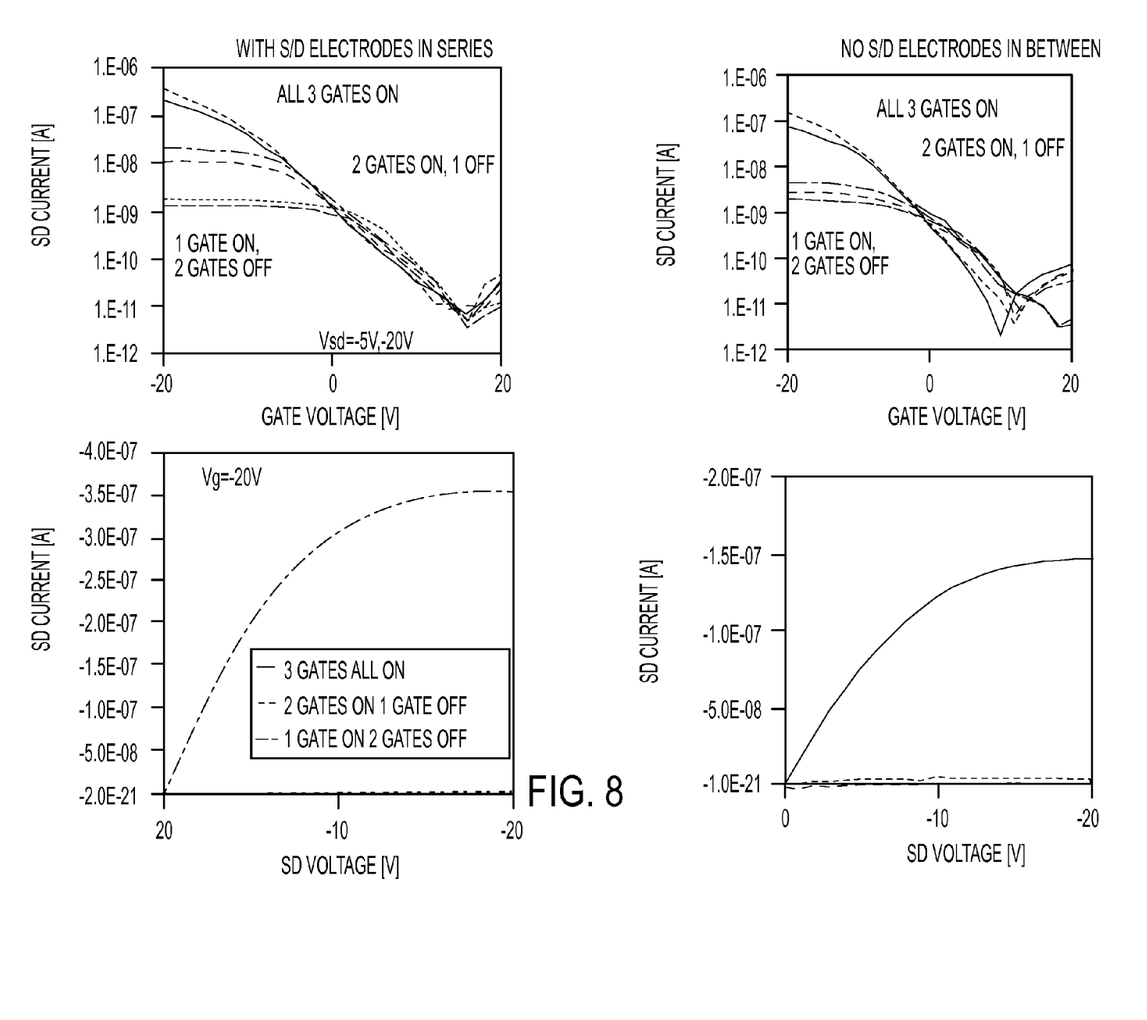
FIG. 8 is an illustrative comparison of current according to embodiments of FIGS. 1-3 versus current according to embodiments of FIGS. 4-7
Figure 9:
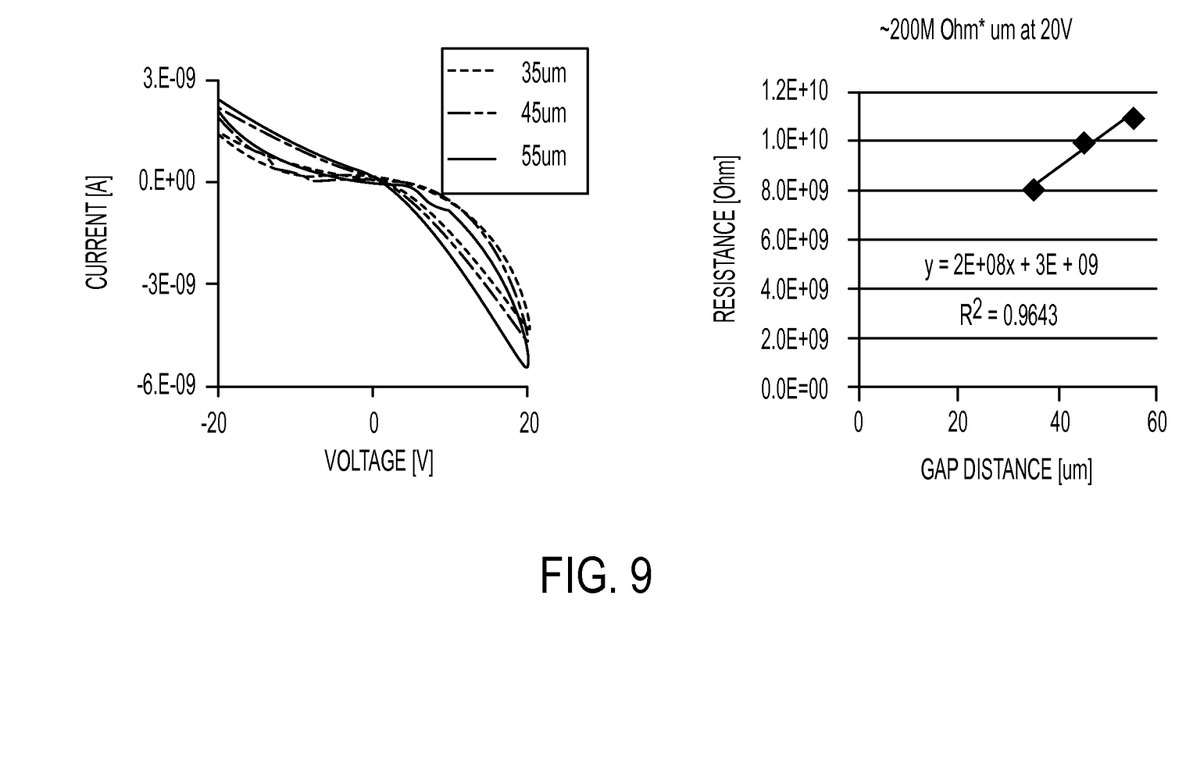
FIG. 9 is an illustrative comparison of the resistivity of commercially available semiconductor according to embodiments.

The low conductivity of organic semiconductor leads to lowering of the output current through the set of three TFTs in series. FIG. 8 compares the current between the structure of FIGS. 1-3 and the structure of FIGS. 4-7. The structure illustrated in FIGS. 4-7 has performance sufficient to function in logic gates, such as in a NAND gate. In adapting this structure for a circuit, it is important to keep a minimal gap between gates, which minimizes the deleterious effects of the high resistivity of the organic semiconductor. The resistivity of commercially available organic semiconductor is estimated in FIG. 9.

Figure 10:
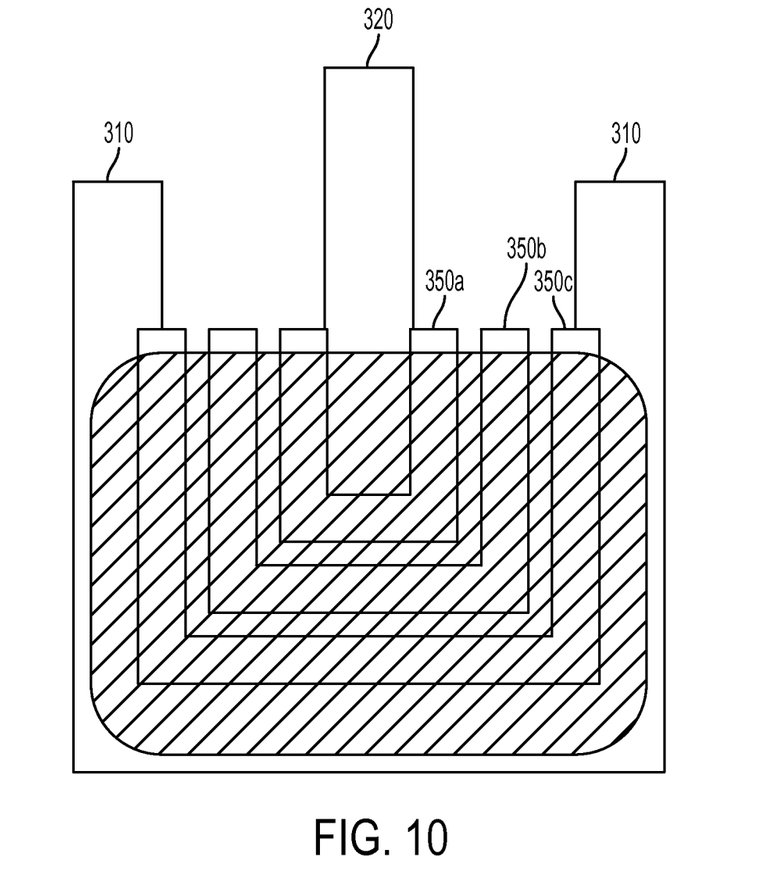
FIG. 10 is another embodiment of the structure of FIGS. 4-7.

An alternate embodiment of the layout illustrated in FIGS. 4-7 is shown in FIG. 10. This layout is topologically equivalent to the layout of FIGS. 4-7. A metal layer occupies a portion of source region 310, and a separate metal layer occupies a portion of drain region 320. Source region 310 wraps around drain region 320 in a U-shape. It should also be recognized that the roles between source and drain may be reversed in another embodiment, as well as the polarity of the successive transistors. Conductive gates 350a-c are printed atop a dielectric material (not shown), which separates them from the semiconductor substrate (shown in shaded relief), source region 310, drain region 320, and intermediary source/drain regions (not shown). Like the structure in FIGS. 4-7, a liquid or liquid emulsion of organic semiconductor material is spread over the source and drain regions, which later forms a solid thin film prior to application of the dielectric material.

Figure 11:
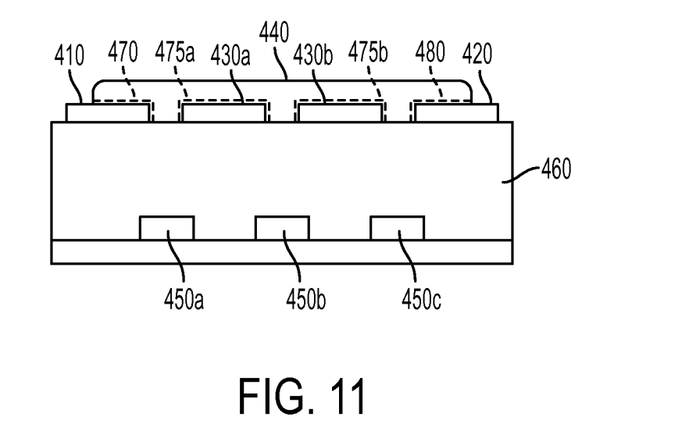
FIG. 11 is a side view of an exemplary stack of three thin film transistors arranged in series, in bottom-gate orientation.
Figure 12:
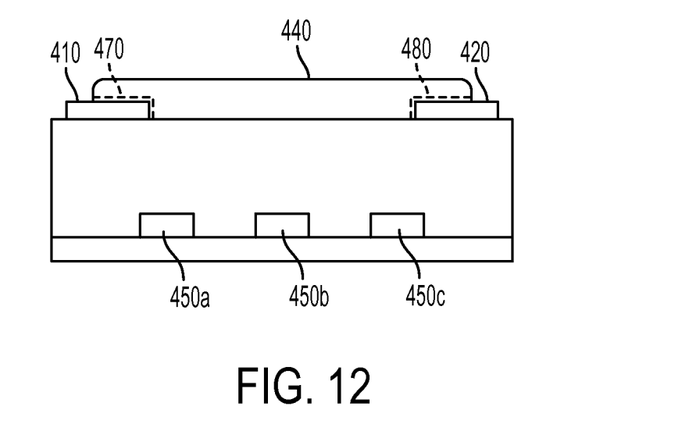
FIG. 12 is a side view of FIG. 11, without metal layers in the intermediary source and drain regions.

Whereas FIGS. 1-3 and 4-7 show a top-gate, FIGS. 11 and 12 illustrate an alternate, bottom-gate embodiment. A dielectric material 460 separates gates 450a-c from source/drain regions 470, 480, and 475a-b. Like FIG. 3, metal layers 430a and 430b occupy portions of the source/drain regions 475a and 475b, but is absent in FIG. 12. A liquid or liquid emulsion of organic semiconductor material 440 is spread over the source/drain regions and forms a solid thin film.

Figure 13:
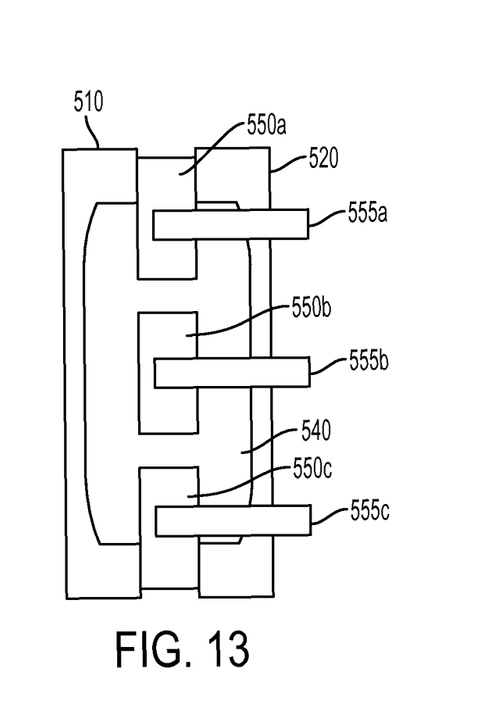
FIG. 13 is an exemplary top view of a stack of three TFTs arranged in parallel.
Figure 14:
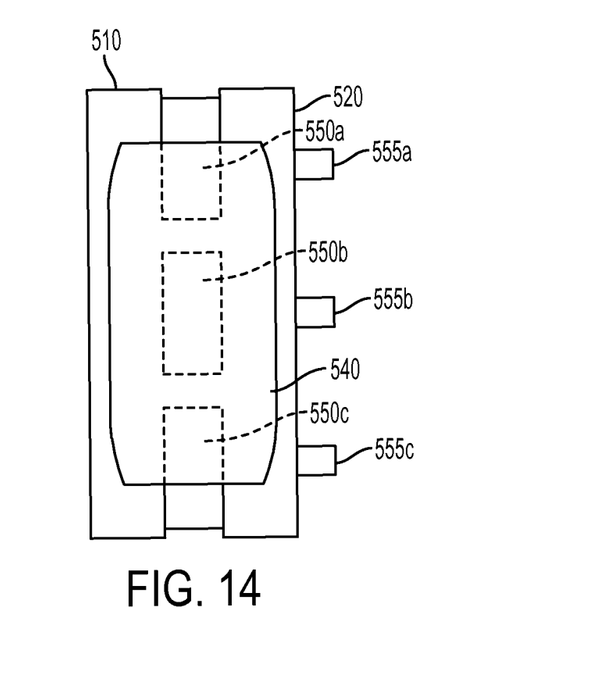
FIG. 14 is a bottom view of FIG. 13.

FIGS. 1-7 and 10 show three or more TFTs connected in series. In contrast, an alternative embodiment shown in FIGS. 13 and 14 arranges TFTs in parallel. FIG. 13 represents a top view, and FIG. 14 represents a bottom view. A single source region 510, a single drain region 520, and a single channel region 540 are used. Multiple gates 550a-c are aligned in a row with as small a separation between them as possible. Interconnects 555a-c are attached to each of the gates 550a-c. In this embodiment, the high resistivity of the semiconductor is advantageous, as it leads to a reduction in the leakage of current between source and drain. Moreover, this embodiment is especially advantageous for a printed process in which the gates 550a-c are deposited in a single pass with a constant linear motion and intermittent deposition. It is important to observe that all three TFTs in FIGS. 13 and 14 are unipolar. That is, they can be n-type or p-type in alternate embodiments, but not a combination differing polarities when laid in parallel.

Figure 15:
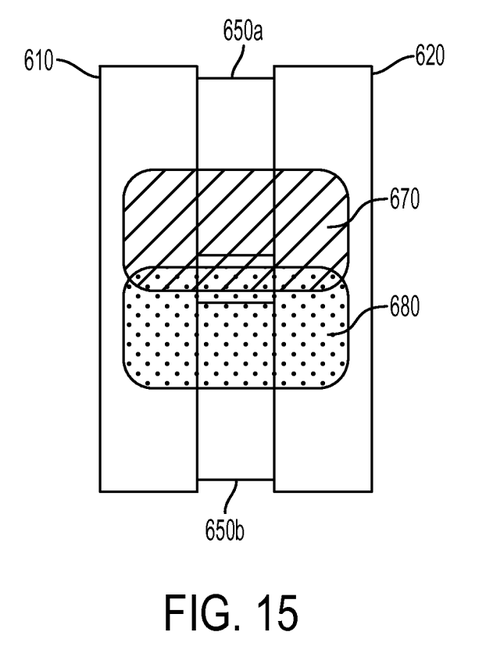
FIG. 15 is an exemplary top view of a transmission gate.

The embodiment of FIG. 15 depicts a transmission gate with two complementary TFTs. A metal layer occupies a portion of a single source region 610, and a metal layer occupies a portion of a single drain region 620. Both the source region 610 and drain region 620 are shared by two TFTs defined, in part, by gates 650a and 650b. In this embodiment, semiconductor material 670 is p-type, and semiconductor material 680 is n-type. Nonetheless, it should be recognized that alternate arrangements are possible, wherein semiconductor 670 is n-type, semiconductor 680 is p-type, region 610 is a drain, or region 620 is a source. The TFTs have separate semiconductor depositions and can flow into one another to a certain extent. This will increase the leakage of current between source region 610 and drain region 620, but the embodiment will still operate. As is the case for the structure illustrated in FIGS. 13 and 15, the gates can be deposited in a single pass of the printing process.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A thin film device, comprising:
   a semiconducting material;
   a first source region;
   a first drain region;
   a first gate;
   a second gate;
   a second source region disposed between the first source region and the first drain region;
   a second drain region disposed between the first source region and the first drain region, wherein the second drain region and the second source region coincide, while the first source region and the first drain region remain the first source region and the first drain region regardless of a state of the second source region or the second drain region;
   a first channel region disposed between the first source region and the coinciding second source and second drain regions;
   a second channel region disposed between the first drain region and the coinciding second source and second drain regions; and
   a dielectric material disposed between the semiconductor and the first and second gates.

2. The device of claim 1, further comprising a plurality of tertiary source regions and a plurality of tertiary drain regions disposed between the first source region and the first drain region, in which at least one of the plurality of tertiary source regions coincides with at least one of the plurality of tertiary drain regions.

3. The device of claim 2, further comprising a plurality of tertiary gates, at least one of which is disposed between the first source region, the first drain region, and at least one of the plurality of tertiary drain regions that coincides with one of the plurality of tertiary source regions, and in which the dielectric material is disposed between the plurality of tertiary gate regions and the semiconductor film.

4. The device of claim 3, wherein at least one of the coinciding source and drain regions contains a conductive material.

5. The device of claim 4, wherein the first drain region and first source region each contain a conductive material.

6. The device of claim 1, wherein the first drain region and first source region each contain a conductive material.

7. The device of claim 6, wherein the first gate and second gate are comprised of a conductive material.

8. The device of claim 2, wherein the plurality of tertiary source regions and the plurality of tertiary drain regions each contain a conductive material.

9. The device of claim 3, wherein the plurality of tertiary gates is comprised of a conductive material.

10. The device of claim 1, wherein the semiconducting material is comprised of a solution material.

11. The device of claim 10, wherein the solution material is comprised of an organic material.

* * * * *